(12) United States Patent
Powell

(10) Patent No.: US 8,861,148 B2
(45) Date of Patent: Oct. 14, 2014

(54) SURGE PROTECTOR, AN HVAC UNIT INCLUDING THE SURGE PROTECTOR AND A METHOD OF TESTING ELECTRICAL EQUIPMENT

(75) Inventor: Joe Ray Powell, Garland, TX (US)

(73) Assignee: Lennox Industries Inc., Richardson, TX (US)

( * ) Notice: Subject to any disclaimer, the term of this patent is extended or adjusted under 35 U.S.C. 154(b) by 210 days.

(21) Appl. No.: 12/845,864

(22) Filed: Jul. 29, 2010

(65) Prior Publication Data

US 2012/0023994 A1   Feb. 2, 2012

(51) Int. Cl.
*H02H 9/04* (2006.01)
*F24F 11/00* (2006.01)
*G01R 31/28* (2006.01)

(52) U.S. Cl.
CPC *H02H 9/04* (2013.01); *F24F 11/00* (2013.01); *G01R 31/2825* (2013.01)
USPC ............. 361/56; 361/111; 361/118; 62/199

(58) Field of Classification Search
CPC .......... F25B 49/02; H02B 1/20; H02H 9/042
USPC ................. 361/111, 56, 118; 62/199
See application file for complete search history.

(56) References Cited

U.S. PATENT DOCUMENTS

| | | | | |
|---|---|---|---|---|
| 5,124,874 A | * | 6/1992 | Sakai | 361/86 |
| 5,315,471 A | * | 5/1994 | Hurley et al. | 361/160 |
| 5,379,606 A | * | 1/1995 | Katsuki et al. | 62/126 |
| 5,625,688 A | * | 4/1997 | Ford et al. | 379/433.09 |
| 6,829,129 B2 | * | 12/2004 | Marsh et al. | 361/111 |
| 7,417,841 B2 | * | 8/2008 | Hotchkiss et al. | 361/103 |
| 7,592,719 B2 | * | 9/2009 | Hoopes | 307/155 |
| 7,940,506 B2 | * | 5/2011 | Lewis | 361/94 |
| 2005/0083628 A1 | * | 4/2005 | Holzenthal, Jr. | 361/118 |
| 2009/0243758 A1 | * | 10/2009 | Januszewski et al. | 333/184 |

OTHER PUBLICATIONS

IEEE Std C62.41.2-2002, Recommended Practice on Characterization of Surges in Low-Voltage (1000 V and Less) AC Power Circuits, Nov. 11, 2002, The Institute of Electrical ad Electronics Engineers, Inc. pp. 7-27.*
Secondary Surge Arrester "Lightning Arrester" Intermatic AG2401 & AG2401C; 2004; 2 pages.
Phoenix Contact Extract from the online catalog PT 2-PE/S-230AC/FM; Order No. 2858357; Mar. 15, 2010; 6 pages.

* cited by examiner

*Primary Examiner* — Zeev V Kitov

(57) ABSTRACT

A surge protector, an HVAC unit including the surge protector and a method of testing electrical equipment employing the surge protector is disclosed. In one embodiment, the surge protector includes: (1) a first lead, a second lead and a third lead and (2) a protective network having three surge protection units with one of the three surge protection units coupled between each distinct combination of the first, second and third leads, the protective network configured to provide simultaneous surge protection between each of the distinct combinations.

10 Claims, 4 Drawing Sheets

SURGE PROTECTOR, AN HVAC UNIT INCLUDING THE SURGE PROTECTOR AND A METHOD OF TESTING ELECTRICAL EQUIPMENT

TECHNICAL FIELD

This application is directed to surge protection devices and protecting heating, ventilating and air conditioning (HVAC) systems employing the surge protection devices.

BACKGROUND

HVAC systems can be used to regulate the environment within an enclosure. Typically, an air blower is used to pull air from the enclosure into the HVAC system through ducts and push the air back into the enclosure through additional ducts after conditioning the air (e.g., heating or cooling the air). HVAC systems typically include an outside, or condensing unit, and an indoor unit, or air handler with an optional evaporating coil. Air handlers are mounted in an attic, closet, rooftop or basement while condensing units, on the other hand, may be installed on a roof or on the ground. Condensing units typically include a compressor, a condensing coil and a condensing fan. Condensing units, as well as the air handler units of HVAC systems, are vulnerable to transient surges.

To protect against damage from transient surges, industry standards and tests have been developed to characterize surges on AC power circuits. For example, IEEE Standard C62.41.2 provides standardized waveforms and other stress parameters to characterize a surge environment at locations on AC power circuits as described in IEEE Standard C62.41.1. The standardized waveforms can be applied to various electrical devices to determine compliance with the IEEE standard. Typically, the electrical devices, such as HVAC components, are tested to insure compliance with the industry standards. Not all of the tested devices, however, pass the standard tests. As such, changes are often needed to the various failed devices to insure compliance.

SUMMARY

In one aspect, the disclosure provides surge protector. In one embodiment, the surge protector includes: (1) a first lead, a second lead and a third lead and (2) a protective network having three surge protection units with one of the three surge protection units coupled between each distinct combination of the first, second and third leads, the protective network configured to provide simultaneous surge protection between each of the distinct combinations.

In another aspect, an HVAC unit is disclosed. In one embodiment, the HVAC unit, includes: (1) a condensing coil, (2) a compressor fluidly coupled to the condensing coil, (3) a condenser fan having a motor and configured to move air over the condensing coil, (4) terminals electrically coupled to the condenser fan and the compressor and configured to receive a three-wire AC voltage supply and (5) a surge protector for providing surge protection for the compressor and the condenser fan motor. The surge protector includes: (5A) a first lead, a second lead and a third lead connected to the voltage terminators and (5B) a protective network having three surge protection units with a first one of the three surge protection units coupled between the first and the second leads, a second one of the three surge protection units coupled between the second and the third leads, a third one of the three surge protection units coupled between the third and the first leads, the first, second and third surge protection units configured to provide simultaneous surge protection between each of the distinct combinations.

In yet another aspect, a method of testing electrical equipment is disclosed. In one embodiment, the method includes: (1) applying surge pulse waves to an electrical device according to an industry test standard, (2) determining if the electrical device withstands the surge pulse waves per the industry test standard, (3) coupling three leads of a surge protector to three voltage input terminals of the electrical device if the electrical device does not withstand the surge pulse waves, wherein the surge protector includes a protective network having three surge protection units with one of the three surge protection units coupled between each distinct combination of the first, second and third leads, the protective network configured to provide simultaneous surge protection between each of the distinct combinations and (4) reapplying the surge pulse waves to the electrical device according to the industry test standard.

BRIEF DESCRIPTION

Reference is now made to the following descriptions taken in conjunction with the accompanying drawings, in which.

DETAILED DESCRIPTION

Disclosed herein is a surge protector that is designed to absorb transient voltages to protect electrical circuits or components coupled thereto. The disclosed surge protector can be coupled to an electrical device during testing to insure compliance with an industry standard. In one embodiment, a surge protector is disclosed that is designed to absorb the ring and combination surge pulse waves as identified by IEEE Standard C62.41.2 which represent typical power line anomalies of a power grid. Thus, the surge protector can be coupled to a device for testing to represent the device as installed. As such, devices that may not comply with industry standards can still be used in installations when coupled to the surge protector. Advantageously, less expensive devices may be used in installations when coupled with the surge protector. For example, HVAC systems can employ components that individually are not in compliance with an industry standard but yet when tested as would be installed in the field, which is as coupled to the disclosed surge protector, the component can comply. HVAC system may employ such components to reduce the overall cost of the HVAC system. As the complexity of components in HVAC systems increase, for example, variable speed motors, a reduction in the overall cost of HVAC system is advantageous. This is especially true when the surge protector is used to protect multiple devices at an HVAC installation.

In one embodiment, the disclosed surge protector prevents power line anomalies from resulting in damage to the electronic or electrical circuits of HVAC equipment in which it is installed. The surge protector may be used with split phase, three-wire (L1 (Hot), L2 (Hot), L3 (Ground)), 50 or 60 HZ systems, where the typical maximum voltage between L1 to L2 to L3 is 240 VAC RMS, +/−10%.

Unlike conventional surge protectors, the disclosed surge protector provides surge protection between each leg of the three-wire AC system. The surge protectors include a protective network that is designed to protect split phase, three-wire circuits, specifically between L1 to L3, L2 to L3 and L1 to L2. In one embodiment, the protective network includes two parallel wired metal oxide varistors (MOVs) between each protection point (e.g., L1, L2 and L3). The parallel-wired MOVs can extend the lifetime of surge protection. The MOVs that are employed for surge protection may be selected based upon the RMS input voltage applied between L1, L2 and L3 of the AC supply voltage. Alternative forms of the surge protector may be derived by the selection of the MOV voltages to accommodate lower or higher voltage needs. Additional alternative forms could eliminate or increase the number of parallel-wired devices coupled to the surge protector.

Figure 1:
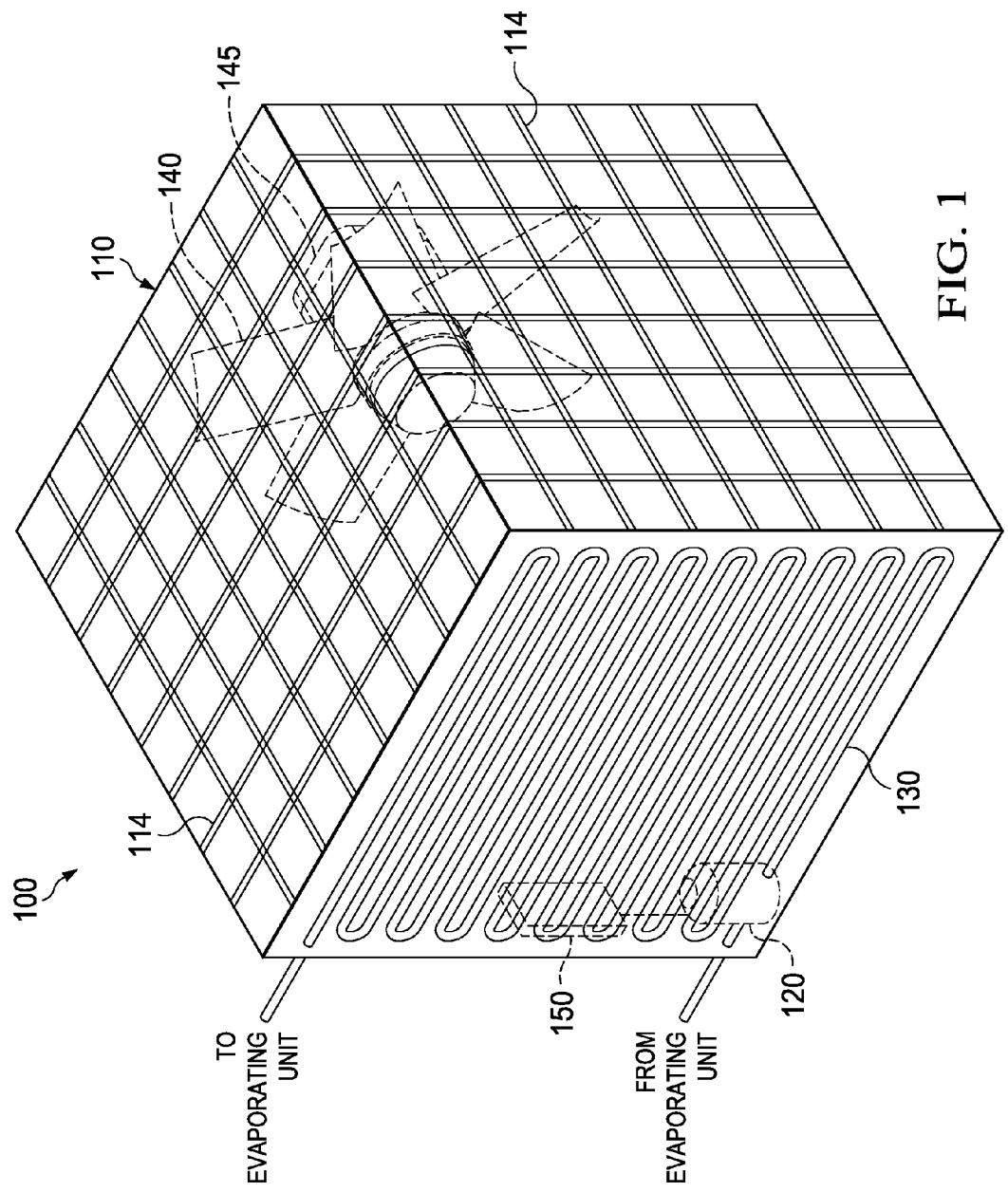
FIG. 1 illustrates a block diagram of an embodiment of a condensing unit of a HVAC system constructed according to the principles of the disclosure.

FIG. 1 illustrates a block diagram of an embodiment of a condensing unit 100 of a HVAC system constructed according to the principles of the disclosure. The condensing unit 100 includes a frame 110, a compressor 120, a condenser 130, a condenser fan 140, a condenser fan motor 145 and a service panel 150.

The condensing unit 100 is an outdoor unit of a HVAC system. The principles of the present disclosure, however, apply to other HVAC or refrigeration units, such as an evaporating unit, and other refrigeration systems, such as commercial and industrial refrigeration systems. The condensing unit 100 is conventionally coupled to an evaporating unit of the refrigeration system. One skilled in the art will understand that the condensing unit 100 may include additional components not illustrated or discussed that are commonly employed within conventional condensing units.

The frame 110 provides protection and support for components of the condensing unit 100. The frame 110 is constructed of a heavy-gauge, galvanized steel that is protected by a baked-on finish for a corrosion-resistant product. The frame 110 includes support feet and drainage holes to raise the condensing unit 100 off the ground and reduce moisture damage. A portion of the frame 110 includes a coil guard 114 that protects the condenser 130 while maintaining efficiency of the condensing unit 100. The frame 110 may also include a service panel that allows access to the service panel 150 or serviceable components without removing sides of the frame 110.

The compressor 120 is mechanically coupled to the frame 110, compresses a refrigerant, such as Freon, causing it to become a hot, high-pressured gas. The compressor 120, along with the condenser fan motor 145, is also electrically coupled to the service panel 150 to receive control wires and an AC voltage supply. The compressor 120 may be coupled to the service panel 150 via a contactor that is configured to provide voltage to the compressor 120.

The condenser 130 coupled to the compressor 120 is a heat transfer coil having multiple passes that allows removal of heat obtained by the refrigerant from the evaporating unit to the environment. The condenser fan motor 145 rotates the condenser fan 140 to move air across the condenser 130 to facilitate the heat transfer. The compressor 120, the condenser 130, the condenser fan 140 and the condenser fan motor 145 may be conventional components typically employed within common condensing units. In one embodiment, at least one of these components, for example the condenser fan motor 145, may not be sufficiently rated per industry standards (i.e., does not pass a standard voltage surge test such as IEEE Standard C62.41.2).

The service panel 150 includes terminators that provide a termination point for internal and external wiring of the condensing unit 100 such as the components thereof, control wiring to the evaporating unit and an AC power supply circuit. Additionally, the service panel 150 includes a surge protector that provides surge protection for the components of the condensing unit 100 such as the compressor 120 and condenser fan motor 145. One skilled in the art will understand that the service panel 150 may include additional control circuitry such as sensors that detect, for example, low pressure or high pressure of the refrigerant or a timer that prevents the compressor 120 from tripping off prematurely when the outside air temperature is cold. In some embodiments, the service panel 150 may be coupled to sensors or timers located in the evaporating unit.

Figure 2:
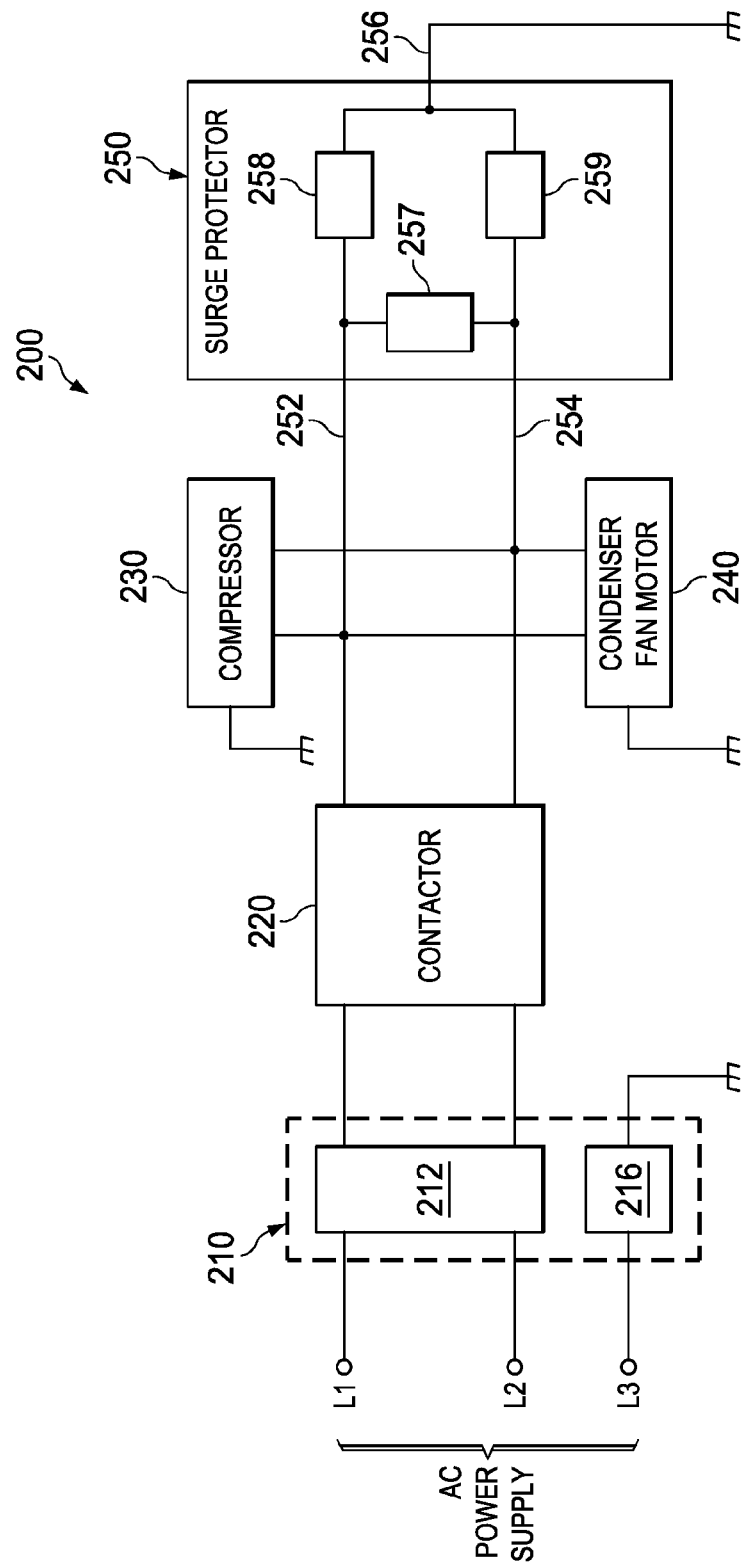
FIG. 2 is block diagram of an embodiment of an outdoor unit, including a surge protector, constructed according to the principles of the disclosure.

FIG. 2 is block diagram of an embodiment of a condensing unit 200, including a surge protector 250, constructed according to the principles of the disclosure. The condensing unit 200 includes a service panel 210, a contactor 220, a compressor 230, a condenser fan motor 240 and a surge protector 250. One skilled in the art will understand that the condensing unit 200 may include additional components that are typically included in a condensing unit but are not illustrated in FIG. 2.

The service panel 210 is configured to provide terminating points and control circuitry for the various devices of the condensing unit 200. The service panel 210 includes a voltage terminator 212 and a ground terminal 216. Additionally, the service panel 210 includes terminals for the AC power supply. Voltage terminal 212 includes terminating points for the two hot legs of the AC power supply which is L1 and L2 in FIG. 2. Ground terminal 216 includes a terminating point for the ground leg of the AC supply which is L3 in FIG. 2.

The contactor 220 is coupled to the voltage terminal 212 and provides power to the compressor 230 and the condenser fan motor 240. The compressor 230 compresses a refrigerant causing it to become a hot, high-pressured gas. The condenser fan motor 240 rotates a fan (not illustrated) to move air across a condenser (not illustrated) to facilitate heat transfer to allow removal of heat obtained by the refrigerant from the evaporating unit to the environment. The contactor 220, the compressor 230 and the condenser fan motor 240 may be conventional components typically employed within common condensing units. The components of the condensing unit 200 may not be rated at a particular industry standard such as a voltage surge standard. This indicates that the components did not pass the designated test or tests associated with the industry standard.

The surge protector 250 is configured to provide surge protection for both the compressor 230 and the condenser fan motor 240. The surge protector 250 includes a first lead 252, a second lead 254 and a third lead 256 connected to the three wires of the AC power supply via the voltage terminal 212 and the ground terminal 216. The three leads 252, 254, 256, of the surge protector 250 may be wires or other conducting material. The three leads 252, 254, 256, represent three protection points of the surge protector 250. The surge protector 250 also includes a protective network having three surge protection units and the necessary circuitry coupling the units together. The three surge protection units may have equal protection capacity. A first one of the three surge protection units, 257, is coupled between the first lead 252 and the second lead 254. A second one of the three surge protection units, 258, is coupled between the first lead 252 and the third lead 256. A third one of the three surge protection units, 259, is coupled between the third lead 256 and the second lead 254.

Figure 3:
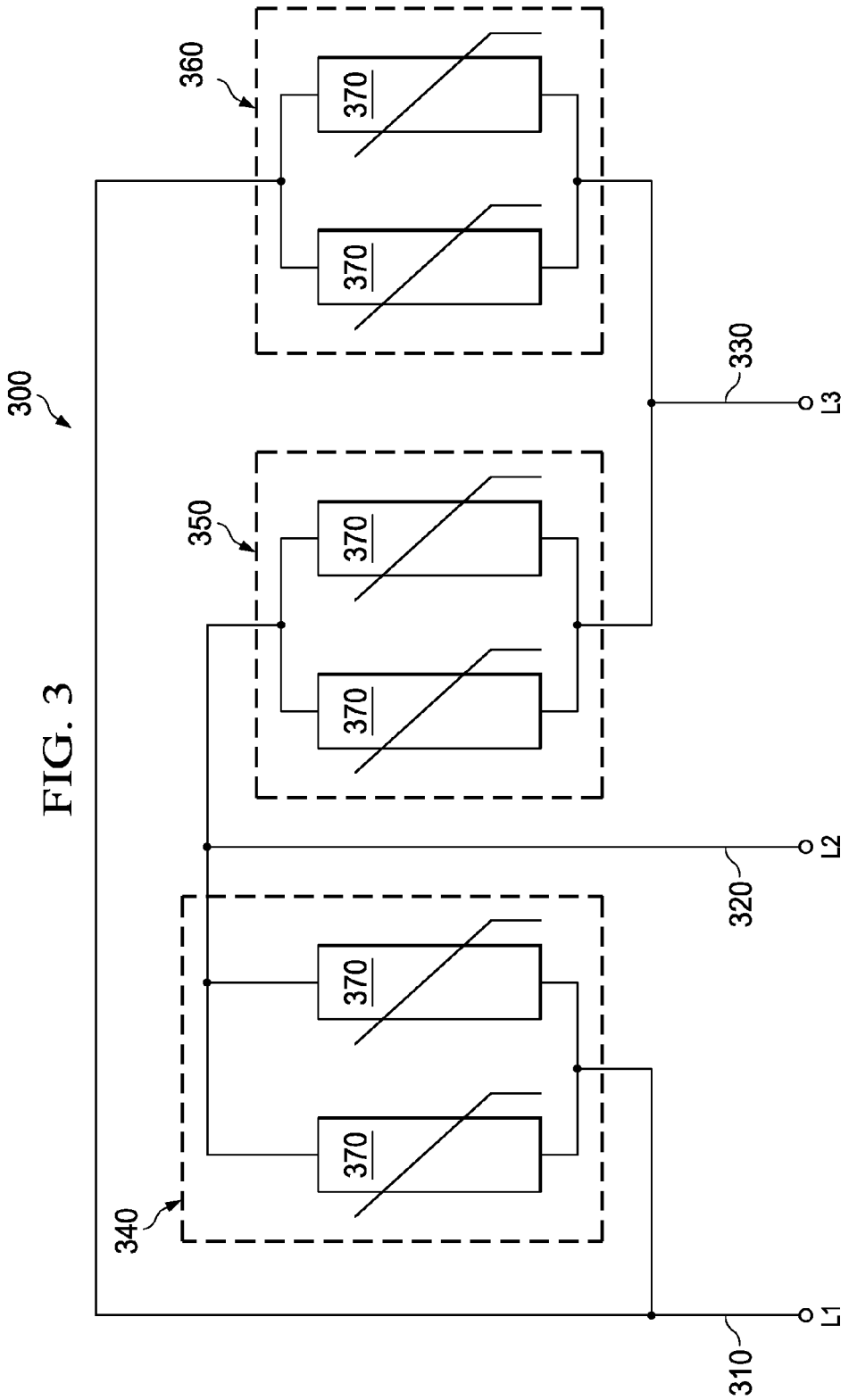
FIG. 3 is schematic diagram of an embodiment of a surge protector constructed according to the principles of the disclosure.

The first, second and third surge protection units 257, 258, 259, are configured to provide simultaneous surge protection between each of the distinct combinations at the designated protection capacity. In one embodiment, the protection capacity of the surge protection units 257, 258, 259, may vary. In one embodiment, the protection capacity is rated to provide protection for ring and combination surge pulse waves as defined by IEEE standard C62.41.2. In other embodiments, the protection capacity of the surge protection units 257, 258, 259, may be rated according to another industry standard. In one embodiment, the surge protection units 257, 258, 259, include a number of parallel-coupled MOVs. As illustrated in FIG. 3, the surge protection units 257, 258, 259, may include two parallel-coupled MOVs.

FIG. 3 is schematic diagram of an embodiment of a surge protector 300 constructed according to the principles of the disclosure. The surge protector 300 is configured to protect electronic or electrical circuits from power line anomalies of a power grid. The surge protector 300 includes a first lead 310, a second lead 320 and a third lead 330. The first, second and third leads 310, 320 and 330, are electrical conductors that enable the surge protector 300 to couple to a three-wire supply voltage.

The surge protector 300 also includes a protective network having three surge protection units 340, 350, 360, of equal protection capacity and the various conductors coupling the surge protection units 340, 350, 360. Each of the three surge protection units is coupled between each distinct combination of the first, second and third leads 310, 320, 330. In FIG. 3, the first lead 310 is positioned between the first surge protection unit 340 and the third surge protection unit 360. The second lead 320 is positioned between the first surge protection unit 340 and the second surge protection unit 350. Additionally, the third lead 330 is positioned between the second surge protection unit 350 and the third surge protection unit 360. In FIG. 3, each of the leads is designated to be coupled to a particular leg of a three-wire AC voltage supply. The first, second and third leads 310, 320, 330, however, are interchangeably couplable to the different conductors of a three-wire AC voltage supply circuit. For example, the first lead 310 can be coupled to L2, the second lead 320 can be coupled to L3 and the third lead 330 can be coupled to L1. The interchangeability of the surge protector 300 is possible due to surge protection units located between each pair of the leads 310, 320 and 330. The protective network is configured to provide simultaneous surge protection between each of the distinct combinations of the leads 310, 320, 330, at the protection capacity.

In FIG. 3, each of the surge protection units 340, 350, 360, include a pair of parallel-coupled MOVs. Each of the MOVs are rated at the same protection capacity and voltage. As such, all of the MOVs are designated as the element 370. A voltage rating of the MOVs 370 is based on an RMS input voltage couplable to the first, second and third leads 310, 320, 330. For example, for an input voltage of 230 VAC RMS, a MOV voltage rating could be 275 VAC RMS, 710V clamping with a 1 Watt maximum power rating.

Figure 4:
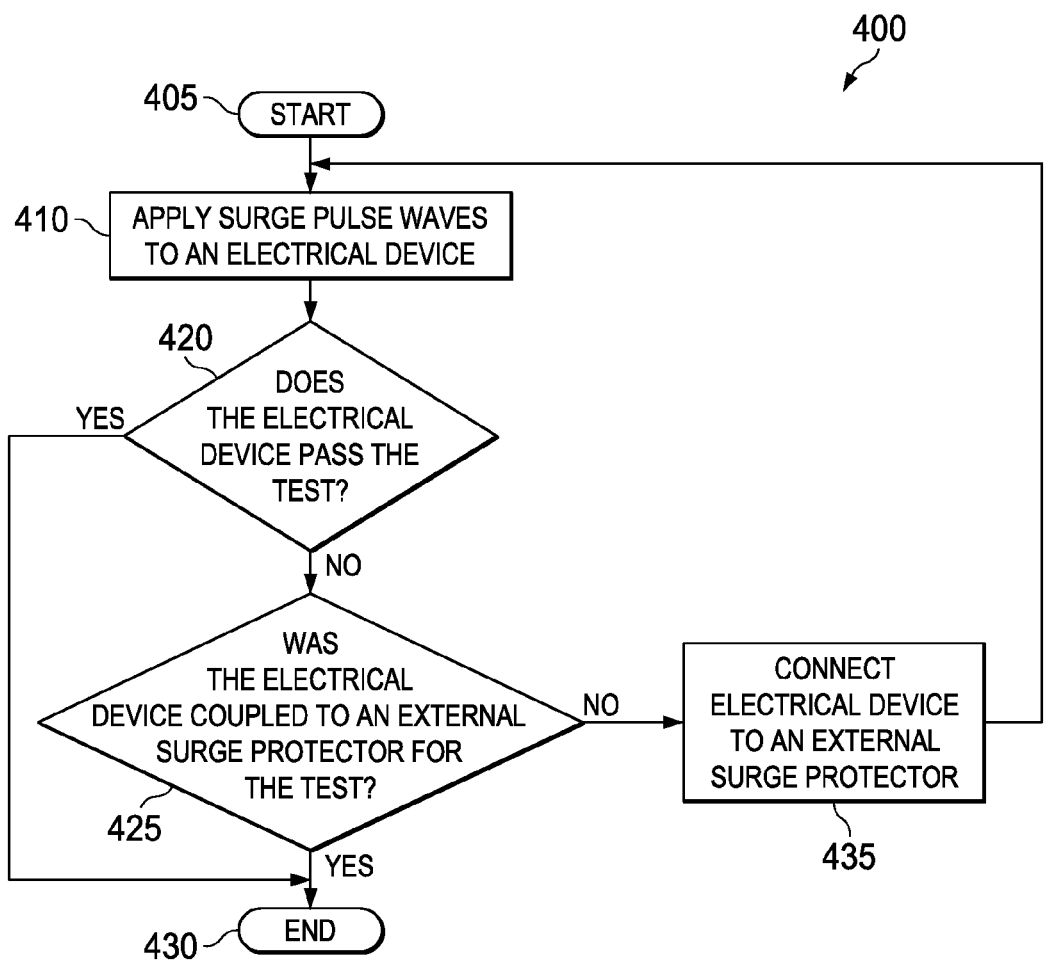
FIG. 4 is a flow diagram of an embodiment of a method for testing electrical equipment carried out according to the principles of the present disclosure.

FIG. 4 is a flow diagram of an embodiment of a method 400 for testing electrical equipment carried out according to the principles of the present disclosure. The method 400 is for testing electrical equipment according to industry standards to determine compliance therewith. The method 400 begins in a step 405.

In a step 410, surge pulse waves are applied to an electrical device according to an industry test standard. The industry test standard may be associated with surge protection. In one embodiment, the industry test standard may be defined by IEEE Standard C62.41.2.

In a first decisional step 420, a determination is made if the electrical device withstands the surge pulse waves per the industry test standard. In other words, a determination is made if the electrical device passes the test. The electrical device may fail a particular part of the test. For example, the electrical device may fail the L1-L2 coupling mode portion of the test.

If the device passes the test, the method 400 proceeds to step 430 and ends. Accordingly, the electrical device can be designated as compliant with the test standard. If the device fails the test, the method 400 continues to a second decisional step 425 where a determination is made if the electrical device was coupled to an external surge protector during the test. If the electrical device was coupled to an external surge protector for the test, then the method 400 continues to step 430 and ends. As such, the electrical device is not in compliance with the test standard even with the surge protector coupled thereto.

If at step 425 a determination is made that the electrical device was tested while uncoupled to an external surge protector, an external surge protector is coupled to the electrical device in a step 435. The three leads of the surge protector are coupled to three voltage input terminals of the electrical device. The surge protector coupled thereto includes a protective network having three surge protection units of equal protection capacity with one of the three surge protection units coupled between each distinct combination of the first, second and third leads. The protective network of the surge protector is configured to provide simultaneous surge protection between each of the distinct combinations at the same protection capacity.

After coupling the surge protector to the electrical device in step 435, the surge pulse waves are reapplied to the electrical device in the step 410 and the method 400 continues.

Those skilled in the art to which this application relates will appreciate that other and further additions, deletions, substitutions and modifications may be made to the described embodiments.

What is claimed is:

1. An HVAC unit, comprising:
    a condensing coil;
    a compressor fluidly coupled to said condensing coil;
    a condenser fan having a motor and configured to move air over said condensing coil;
    terminals electrically coupled to said condenser fan and said compressor and configured to receive a split-phase, three-wire AC voltage supply, wherein a first hot leg of said split-phase, three-wire AC voltage is supplied to said compressor and a second hot leg of said split-phase, three-wire AC voltage is supplied to said motor of said condenser fan; and
    a surge protector collocated in a housing with said compressor and said condenser fan to provide dedicated surge protection for said compressor and said condenser fan motor, including:
        a first lead, a second lead and a third lead connected to said terminals, said first and second leads connected to said three-wire AC voltage supply via a contactor and said surge protector includes no more than three leads; and
    a protective network having three surge protection units with a first one of said three surge protection units coupled between said first and said second leads, a second one of said three surge protection units coupled between said second and said third leads, a third one of said three surge protection units coupled between said third and said first leads, said first, second and third surge protection units having equal protection capacities and configured to provide simultaneous surge protection between each of said distinct combinations.

2. The HVAC unit as recited in claim 1 wherein said terminals include a ground terminal, coupled to a ground wire of said three-wire AC voltage supply.

3. The HVAC unit as recited in claim 1, wherein said third lead is connected to said three-wire AC voltage supply via a ground terminal of said terminals.

4. The HVAC unit as recited in claim 1 wherein said three surge protection units include a number of parallel-coupled metal oxide varistors.

5. The HVAC unit as recited in claim 4 wherein said number is two.

6. The HVAC unit as recited in claim 1 wherein said surge protector is rated to provide protection for ring and combination surge pulse waves as defined by IEEE C62.41.2.

7. The HVAC unit as recited in claim 1 wherein said three-wire AC voltage supply is a 120/240 volt circuit.

8. The HVAC unit as recited in claim 7 wherein said first, said second and said third leads are interchangeably couplable to wires of said three-wire AC voltage supply.

9. The HVAC unit as recited in claim 4 wherein each of said parallel-coupled metal oxide varistors are rated based on an RMS input voltage of said three-wire AC voltage supply.

10. The HVAC unit as recited in claim 6 wherein said compressor or said condenser fan are not rated to withstand ring and combination surge pulse waves as defined by IEEE C62.41.2.

* * * * *